United States Patent
Yamamoto

(10) Patent No.: US 10,615,609 B2
(45) Date of Patent: Apr. 7, 2020

(54) SELECTION APPARATUS FOR SELECTING MOTOR SYSTEM AND NETWORK SYSTEM

(71) Applicant: FANUC CORPORATION, Yamanashi (JP)

(72) Inventor: Kenta Yamamoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 165 days.

(21) Appl. No.: 15/351,515

(22) Filed: Nov. 15, 2016

(65) Prior Publication Data

US 2017/0141581 A1    May 18, 2017

(30) Foreign Application Priority Data

Nov. 17, 2015    (JP) .................................. 2015-224846

(51) Int. Cl.
*H02J 4/00* (2006.01)
*G06Q 10/06* (2012.01)
*G06F 17/50* (2006.01)

(52) U.S. Cl.
CPC ................ *H02J 4/00* (2013.01); *G06Q 10/06* (2013.01); *G06F 17/50* (2013.01)

(58) Field of Classification Search
CPC ............. G06F 17/50; G06Q 10/06; H02J 4/00
See application file for complete search history.

(56) References Cited

U.S. PATENT DOCUMENTS

| 5,504,687 A * | 4/1996 | Wolf ........................ G06F 17/50 700/95 |
| 2007/0187367 A1* | 8/2007 | Kita ......................... B23H 7/26 219/69.11 |
| 2013/0338814 A1 | 12/2013 | Uchida et al. |

FOREIGN PATENT DOCUMENTS

| CN | 101878589 A | 11/2010 |
| CN | 103209866 A | 7/2013 |
| CN | 103488123 A | 1/2014 |

(Continued)

OTHER PUBLICATIONS

English translation of JP 2010187464.*

(Continued)

*Primary Examiner* — Rexford N Barnie
*Assistant Examiner* — Elim Ortiz
(74) *Attorney, Agent, or Firm* — Fredrikson & Byron, P.A.

(57) ABSTRACT

A selection apparatus includes a storage unit for storing a start-up condition of the selection apparatus and specification data representing performance of each of a plurality of motor systems, an information reception unit for receiving start-up information and machine condition, a start-up determination unit that determines that start-up can be performed when the start-up information received by the information reception unit is coincident with the start-up condition stored in the storage unit and determines that start-up cannot be performed in the case of noncoincidence thereof, a selection unit that collates, when the start-up determination unit determines that start-up can be performed, the machine condition received by the information reception unit with the specification data and executes selection processing for selecting the motor system conforming to the machine condition from among a plurality of the motor systems, and an information output unit for outputting a processing result by the selection unit.

3 Claims, 4 Drawing Sheets

(56) References Cited

FOREIGN PATENT DOCUMENTS

| | | | |
|---|---|---|---|
| CN | 104184152 A | | 12/2014 |
| CN | 104838394 A | | 8/2015 |
| DE | 10156330 B4 | | 6/2008 |
| DE | 102006059829 A1 | | 6/2008 |
| JP | 200385179 A | | 3/2003 |
| JP | 2004070586 A | | 3/2004 |
| JP | 2010187464 A | * | 8/2010 |
| JP | 2010187464 A | * | 8/2010 |
| JP | 201527244 A | | 2/2015 |
| WO | 2004029845 A1 | | 4/2004 |
| WO | 2014054142 A1 | | 4/2014 |

OTHER PUBLICATIONS

English translation of JP 2010187464 (Year: 2010).*
Untranslated Decision to Grant a Patent mailed by Japan Patent Office (JPO) for Application No. JP 2015-224846 dated May 3, 2018, 3 pages.
English machine translation of Decision to Grant a Patent mailed by Japan Patent Office (JPO) for Application No. JP 2015-224846 dated May 8, 2018, 3 pages.
Untranslated Notification of Reasons for Refusal mailed by Japan Patent Office (JPO) for Application No. JP 2015-224846 dated Dec. 5, 2017, 2 pages.
Translated Notification of Reasons for Refusal mailed by Japan Patent Office (JPO) for Application No. JP 2015-224846 dated Dec. 5, 2017, 2 pages.
English Abstract for Japanese Publication No. 2015-027244 A, published Feb. 5, 2015, 1 pg.
English Abstract and Machine Translation for WO Publication No. 2014-054142 A1, published Aug. 25, 2016, 16 pgs.
English Abstract and Machine Translation for Japanese Publication No. 2010-187464 A, published Aug. 26, 2010, 25 pgs.
English Abstract and Machine Translation for Japanese Publication No. 2003-085179 A, published Mar. 20, 2003, 31 pgs.
English Abstract and Machine Translation for German Publication No. 102006059829 A1, published Jun. 19, 2008, 3 pgs.
English Abstract and Machine Translation for German Publication No. 10156330 B4, published Jun. 26, 2008, 16 pgs.
English Abstract and Machine Translation for Chinese Publication No. 101878589 A, published Nov. 3, 2010, 15 pgs.
English Abstract and Machine Translation for Chinese Publication No. 104838394 A, published Aug. 12, 2015, 16 pgs.
English Abstract and Machine Translation for Chinese Publication No. 104184152 A, published Dec. 3, 2014, 15 pgs.
English Abstract and Machine Translation for Chinese Publication No. 103209866 A, published Jul. 17, 2013, 25 pgs.
English Abstract and Machine Translation for Chinese Publication No. 103488123 A, published Jan. 1, 2014, 1 pg.
English Abstract and Machine Translation for Japanese Publication No. 2004-070586, published Mar. 4, 2004, 17 pgs.

* cited by examiner

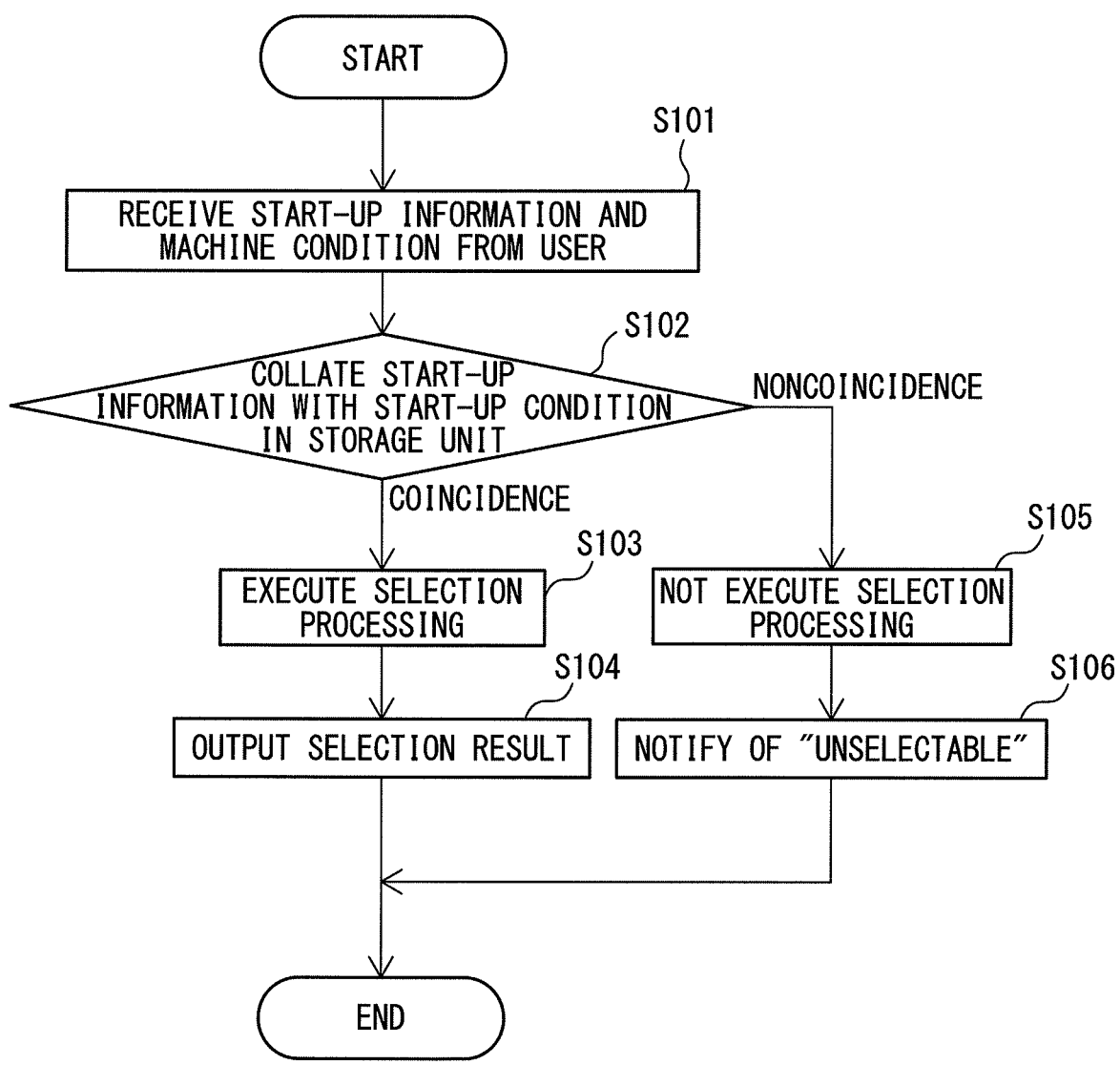

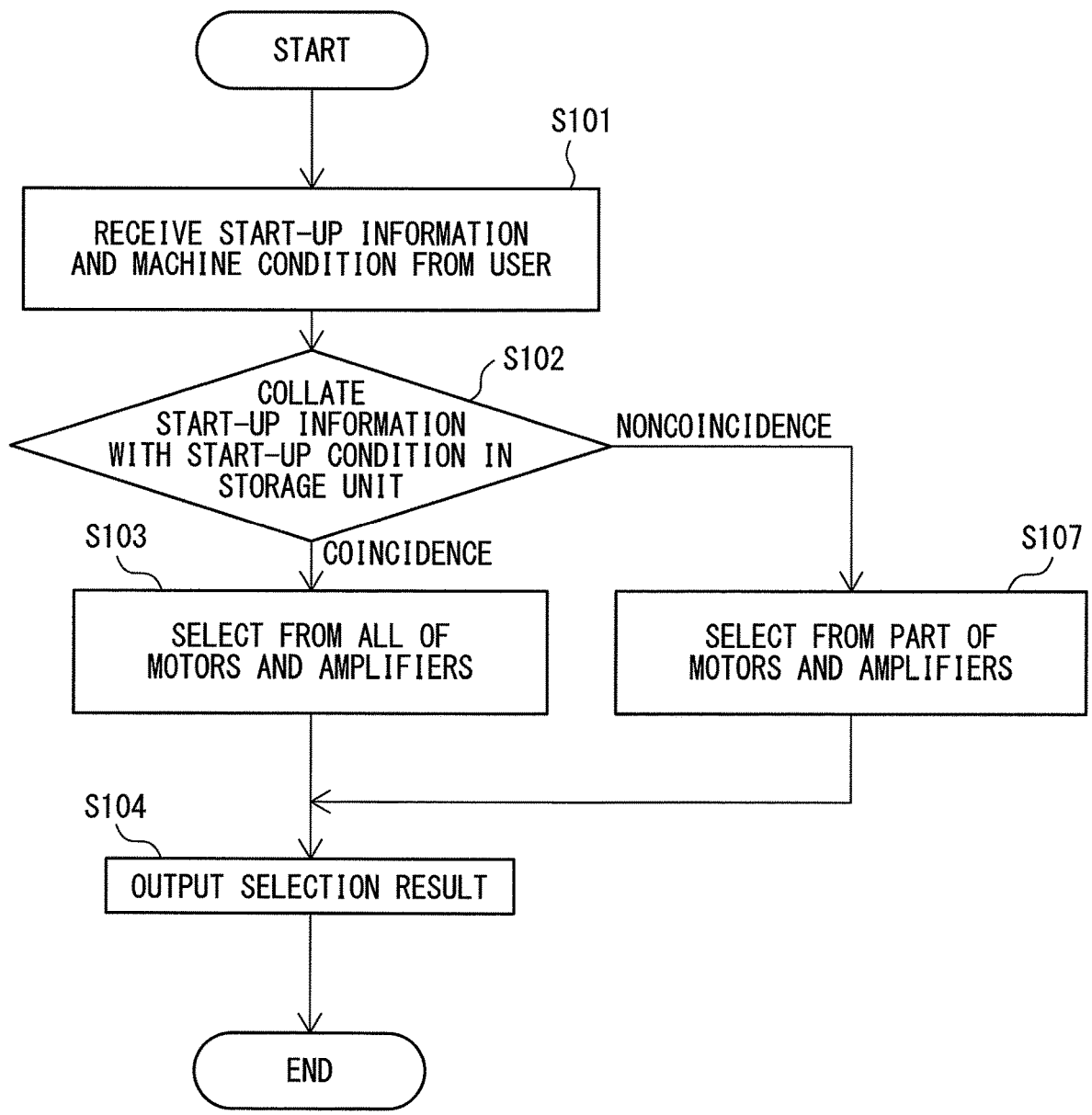

SELECTION APPARATUS FOR SELECTING MOTOR SYSTEM AND NETWORK SYSTEM

BACKGROUND OF THE INVENTION

1. Field of the Invention

The present invention relates to a selection apparatus for selecting a motor system and a network system.

2. Description of the Related Art

Machinery makers (users) who design machine tools, forging machines, injection molding machines, industrial machines, robots, and the like need to select motors to be used and amplifier motor systems for supplying electricity to the motors in view of various machine information pieces when designing the machines. In the selection of the motor systems, selection apparatuses provided by motor makers (manufacturers) are used.

In order to select the motor systems based on the latest information, it is preferable that the machinery makers and the motor makers frequently exchange information with each other for the selection, so that, recently, the motor makers distribute or provide via networks the selection apparatuses of the motor systems.

For example, as described in Japanese Unexamined Patent Publication (Kokai) No. 2015-27244, it has been known that a selection apparatus for selecting a motor system conforming to conditions input by a user is provided on a client server on a network.

Further, when the selection apparatus is provided via the network, information of the motor system is generally encrypted or protected from a direct access from a viewpoint of security.

For example, as described in WO 2004/029845, a combination equipment selection system has been known which determines whether to allow display of a selection result of equipment such as a motor based on user information.

When the selection apparatus for selecting the motor system is provided via the network, information of the motor system is encrypted or protected from a direct access, however, there is a risk that a third party on the network acquires and analyzes a plurality of selection results by inputting various machine conditions to the selection apparatus and estimates the information of the motor system.

SUMMARY OF INVENTION

In view of the problem as described above, it is an object of the invention to provide a selection apparatus for selecting a motor system and a network system in which a selection result is disclosed only to a specific user.

In order to achieve the above-described object, a selection apparatus for selecting a motor system includes a storage unit configured to store a start-up condition of the selection apparatus and specification data representing performance of each of a plurality of the motor systems, an information reception unit configured to receive input start-up information and machine condition, a start-up determination unit configured to determine that start-up can be performed when the start-up information received by the information reception unit is coincident with the start-up condition stored in the storage unit and determine that start-up cannot be performed in the case of noncoincidence thereof, a selection unit configured to, when the start-up determination unit determines that start-up can be performed, collate the machine condition received by the information reception unit with the specification data stored in the storage unit and execute selection processing for selecting the motor system conforming to the relevant machine condition from among a plurality of the motor systems, and an information output unit configured to output a processing result by the selection unit.

The motor system may include a motor and an amplifier configured to supply electricity to the motor, the specification data may include motor specification data representing performance of each of a plurality of the motors and amplifier specification data representing performance of each of a plurality of the amplifiers, and the selection unit may execute, as the selection processing executed when the start-up determination unit determines that start-up can be performed, processing in which a motor conforming to the machine condition received by the information reception unit is selected from among the plurality of the motors by collating the machine condition received by the information reception unit with the motor specification data, and an amplifier capable of driving the selected motor is selected from among the plurality of the amplifiers with reference to the amplifier specification data.

Further, when the start-up determination unit determines that start-up cannot be performed, the selection unit may not execute the selection processing.

Further, when the start-up determination unit determines that start-up cannot be performed, the selection unit may select a motor conforming to the machine condition received by the information reception unit from a part of motors among the plurality of the motors by collating the machine condition received by the information reception unit with the motor specification data and select an amplifier capable of driving the selected motor from a part of amplifiers among the plurality of the amplifiers with reference to the amplifier specification data.

Further, a network system includes the above-described selection apparatus and a terminal configured to be communicably connected to the information reception unit via a network and receive an input of the machine condition from a user.

BRIEF DESCRIPTION OF THE DRAWINGS

The invention will be understood more clearly by referring to the following accompanying drawings:

FIG. 3 is a flowchart illustrating an example of an operation flow of a selection apparatus illustrated in FIG. 1; and FIG. 4 is a flowchart illustrating a variation of the operation flow of the selection apparatus illustrated in FIG. 1.

DETAILED DESCRIPTION

A selection apparatus for selecting a motor system and a network system will be described below with reference to the drawings. It should be understood that the present invention is not limited to the drawings or embodiments described below.

Figure 1:
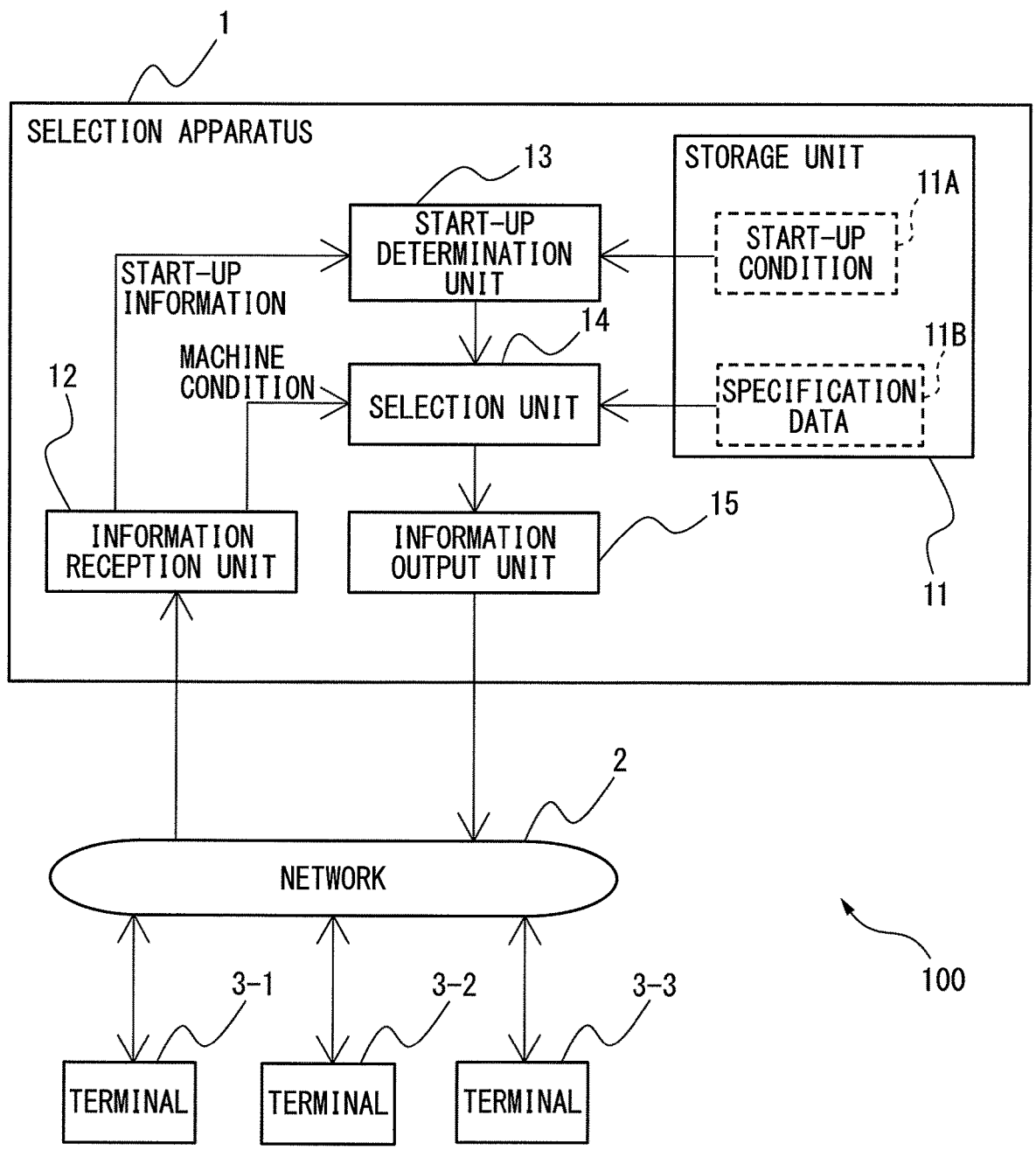
FIG. 1 is a block diagram illustrating a network system in an embodiment.
Figure 2:
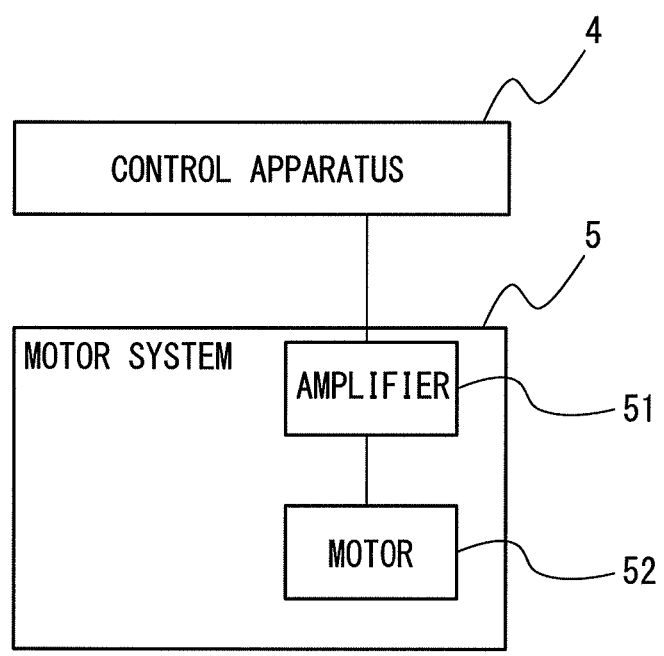
FIG. 2 is a block diagram illustrating a motor system.

FIG. 1 is a block diagram illustrating a network system in an embodiment. FIG. 2 is a block diagram illustrating a motor system.

A motor system 5 illustrated in FIG. 2 is constituted based on a selection result by a selection apparatus 1 illustrated in FIG. 1. The motor system 5 is connected to a control apparatus 4 for controlling an operation of the motor system 5, for example, a robot controller for controlling an industrial robot, a machine tool control unit for controlling a machine tool such as a numerical control (NC) machining center, or the like. The motor system 5 includes a motor 52 and an amplifier 51 for supplying electricity to the motor 52. The motor 52 is, for example, a servomotor built in a robot arm of an industrial robot or a main axis of a machine tool. The amplifier 51 transmits the electricity to the motor 52 in response to a command from the control apparatus 4 and rotates and drives the motor 52.

As illustrated in FIG. 1, in the embodiment, a network system 100 includes the selection apparatus 1, a network 2, and terminals 3-1, 3-2, and 3-3. In the illustrated example, the number of the terminals is three, however, the number of the terminals is not to limit the present invention and may be other than three.

The terminals 3-1, 3-2, and 3-3 are computers including, for example, central processing units (CPUs), display units, keyboards, mice, and the like, and installed outside of the selection apparatus 1. A user can input information to the terminals 3-1, 3-2, and 3-3. The terminals 3-1, 3-2, and 3-3 are communicably connected to an information reception unit 12 and an information output unit 15 in the selection apparatus 1 via the network 2.

The terminals 3-1, 3-2, and 3-3 transmit information input by the user to the information reception unit 12 in the selection apparatus 1 via the network 2. On the other hand, the terminals 3-1, 3-2, and 3-3 receive information transmitted from the information output unit 15 in the selection apparatus 1 via the network 2. The network 2 is, for example, the Internet or a communication network such as a local area network (LAN).

The selection apparatus 1 includes a storage unit 11, the information reception unit 12, a start-up determination unit 13, a selection unit 14, and the information output unit 15. In FIG. 1, a connection relationship between each block is functionally illustrated. In fact, the storage unit 11, the information reception unit 12, a CPU (not illustrated) including the start-up determination unit 13 and the selection unit 14, and the information output unit 15 are communicably connected via a bus (not illustrated), and the CPU executes various arithmetic operations while exchanging information with the information reception unit 12, the information output unit 15, and the storage unit 11.

The storage unit 11 stores a start-up condition of the selection apparatus 1 and specification data representing performance of each of a plurality of the motor systems. The storage unit 11 includes an area 11A for storing the start-up condition and an area 11B for storing the specification data. The storage unit 11 is constituted of an electrically erasable and recordable nonvolatile memory such as an Electrically Erasable and Programmable Read Only Memory (EEPROM) (registered trademark) or a random access memory capable of reading and writing at high speed such as a dynamic random access memory (DRAM) and a static random access memory (SRAM). In the illustrated example, the storage unit 11 is built in the selection apparatus 1, however, instead of this, the storage unit 11 may be built in an external apparatus (for example, a server) communicably connected via the network 2. The specification data is described in detail below.

The information reception unit 12 receives start-up information and machine conditions which are input. As described above, the information reception unit 12 is connected to the terminals 3-1, 3-2, and 3-3 via the network 2. When a user inputs the start-up information and the machine conditions to the terminals 3-1, 3-2, and 3-3, the information reception unit 12 receives the start-up information and the machine conditions from the terminals 3-1, 3-2, and 3-3 via the network 2. The information reception unit 12 transmits the start-up information received from the terminals 3-1, 3-2, and 3-3 to the start-up determination unit 13 and the machine conditions to the selection unit 14. The start-up information and the machine conditions are described in detail below.

The start-up determination unit 13 determines that the start-up can be performed when the start-up information received by the information reception unit 12 is coincident with the start-up condition stored in the storage unit 11, and determines that the start-up cannot be performed in the case of noncoincidence thereof. A determination result by the start-up determination unit 13 is transmitted to the selection unit 14.

When the start-up determination unit 13 determines that the start-up can be performed, the selection unit 14 collates the machine conditions received by the information reception unit 12 with the specification data pieces stored in the storage unit 11 and executes selection processing for selecting a motor system conforming to the machine conditions from among a plurality of the motor systems. In the present embodiment, when the start-up determination unit 13 determines that the start-up cannot be performed, the selection unit 14 does not execute the selection processing.

The information output unit 15 is connected to the terminals 3-1, 3-2, and 3-3 via the network 2 and transmits information to the terminals 3-1, 3-2, and 3-3 via the network 2 in response to a command from the CPU including the start-up determination unit 13 and the selection unit 14. A processing result (selection result) by the selection unit 14 when the start-up determination unit 13 determines that the start-up can be performed and information of "unselectable" when the start-up determination unit 13 determines that the start-up cannot be performed are transmitted by the information output unit 15 to the terminal 3 via the network 2. As described above, the terminals 3-1, 3-2, and 3-3 include the display units and can display the information received from the information output unit 15.

In the present embodiment, the terminals 3-1, 3-2, and 3-3 and the selection apparatus 1 are connected with each other via the network 2. Thus, for example, when the terminals 3-1, 3-2, and 3-3 are installed to a machine tool manufacturer side, and the selection apparatus 1 is installed to a motor manufacturer, the machine tool manufacturer can quickly and easily select the latest motor system manufactured by the motor manufacturer and use the latest motor system to the design of the machine tool and the like. The terminals 3-1, 3-2, and 3-3 and the selection apparatus 1 may be directly connected to each other without the network. Further, the terminals 3-1, 3-2, and 3-3 and the network 2 or the network 2 and the selection apparatus 1 may be connected to each other wirelessly or by wire.

Examples of the start-up information and the machine conditions received by the information reception unit 12 and the start-up condition and the specification data pieces stored in the storage unit 11 are described.

The start-up information received by the information reception unit 12 and the start-up condition stored in the storage unit 11 include, for example, a password, specific information included in each of the terminals 3-1, 3-2, and 3-3, and the like.

A password used as the start-up information and the start-up condition is constituted of a combination of characters and/or numerals. A provider of the selection apparatus 1 (for example, the motor maker) preliminarily incorporates a password in the storage unit 11 before providing the selection apparatus 1 to a user (for example, the machinery maker). When the selection apparatus 1 is provided to the user (for example, the machinery maker), the provider of the selection apparatus 1 separately notifies the user who is allowed to use the selection apparatus 1 of the password. When the user inputs the password via the terminals 3-1, 3-2, and 3-3, the password is transmitted from the information reception unit 12 to the start-up determination unit 13. The start-up determination unit 13 determines that the start-up can be performed when the received password is coincident with the password stored in the storage unit 11 and determines that the start-up cannot be performed in the case of noncoincidence thereof.

On the other hand, the specific information used as the start-up information and the start-up condition is generally assigned to each computer for identifying the computer constituting each of the terminals 3-1, 3-2, and 3-3. In the illustrated example, three terminals are illustrated, however, the specific information is different for each terminal. The provider of the selection apparatus 1 (for example, the motor maker) preliminarily incorporates the specific information of the terminal(s) 3-1, 3-2, and/or 3-3 allowed to be used in the storage unit 11 before providing the selection apparatus 1 to the user (for example, the machinery maker). After providing the selection apparatus 1 to the user (for example, the machinery maker), when the machine conditions are input from the terminal(s) 3-1, 3-2, and/or 3-3, the specific information of the terminal used for the input of the machine conditions is transmitted together with the machine conditions to the information reception unit 12 via the network 2. One specific example is described in which, for example, when only the terminal 3-1 is allowed to be used in the three terminals 3-1, 3-2, and 3-3, and the specific information of the terminal 3-1 is preliminarily incorporated in the storage unit 11, and when the user inputs the machine conditions by operating the terminal 3-1, the specific information of the terminal 3-1 is transmitted together with the machine conditions to the information reception unit 12 via the network 2. The specific information of the terminal 3-1 is further transmitted together with the machine conditions from the information reception unit 12 to the start-up determination unit 13. The start-up determination unit 13 determines that the start-up can be performed since the received specific information of the terminal 3-1 is coincident with the specific information stored in the storage unit 11. Further, for example, when the user inputs the machine conditions by operating the terminal 3-3, the specific information of the terminal 3-3 is transmitted together with the machine conditions to the information reception unit 12 via the network 2. The specific information of the terminal 3-3 is further transmitted together with the machine conditions from the information reception unit 12 to the start-up determination unit 13. The start-up determination unit 13 determines that the start-up cannot be performed since the received specific information of the terminal 3-3 is not coincident with the specific information (the terminal 3-1) stored in the storage unit 11. In the above-described example, the number of the terminals allowed to be used is one, however, this is the merely example, and some numbers of the terminals other than one may be allowed to be used.

The machine conditions received by the information reception unit 12 are various parameters of the motor system to be designed by a user. The user operates the terminal 3 and inputs the machine conditions. Table 1 indicates examples of the machine conditions, however, other parameters may be included in the machine conditions. The display unit of the terminal 3 displays a data input image as indicated in Table 1 to the user.

| MACHINE CONDITION OF MOTOR SYSTEM |
|---|
| MOVING DISTANCE [m] |
| POSITIONING TIME [sec] |
| FEEDING SPEED [rpm] |
| ROTATION-LINEAR TRANSFORM COEFFICIENT [m/rad] |

In the above-described example, the user inputs the machine conditions of a desired motor system to columns of "moving distance", "positioning time", "feeding speed", "rotation-linear transform coefficient" displayed on the display unit of the terminal 3 by operating a keyboard and a mouse of the terminal 3. The terminal 3 transmits the information regarding the machine conditions input by the user to the information reception unit 12 via the network 2. The information reception unit 12 receives the information regarding the machine conditions from the terminal 3.

The specification data pieces stored in the storage unit 11 include motor specification data representing performance of each of a plurality of the motors and amplifier specification data representing performance of each of a plurality of the amplifiers.

Table 2 indicates specification data pieces (the motor specification data) of a plurality of the motors applicable as the motor 52, however, other parameters may be included in the motor specification data. As indicated in Table 2, the motor specification data pieces stored in the storage unit 11 include information representing performance of each of a plurality of types of the motors.

| | MOTOR MODEL No. | | | |
|---|---|---|---|---|
| | M-01 | M-02 | M-03 | ... |
| RATED OUTPUT [W] | 50 | 100 | 150 | ... |
| RATED TORQUE [N · m] | 0.16 | 0.33 | 0.48 | ... |
| INERTIA MOMENT OF ROTOR × 10-4 [kg m2] | 0.04 | 0.066 | 0.092 | ... |
| INERTIA MOMENT OF ALLOWABLE LOAD (MAGNIFICATION OF INERTIA MOMENT OF ROTOR) | 40 | 20 | 15 | ... |
| TORQUE-SPEED CHARACTERISTIC | P1 | P2 | P3 | |

Table 3 indicates specification data pieces (the amplifier specification data) of a plurality of the amplifiers applicable as the amplifier 51, however, other parameters may be included in the amplifier specification data. As indicated in Table 3, the amplifier specification data pieces stored in the storage unit 11 include information representing performance of each of a plurality of types of the amplifiers.

| | AMPLIFIER MODEL No. | | | |
|---|---|---|---|---|
| | A-01 | A-02 | A-03 | ... |
| RATED OUTPUT CURRENT [A] | 1.1 | 3.3 | 11 | ... |
| RATED CURRENT OF MAIN CIRCUIT POWER SUPPLY [A] | 0.9 | 3.3 | 10.5 | ... |
| POWER CONSUMPTION OF CONTROL CIRCUIT POWER SUPPLY [W] | 30 | 30 | 45 | ... |
| ALLOWABLE REGENERATIVE POWER [W] | 10 | 10 | 20 | ... |

In the selection processing by the selection unit 14, first, the machine conditions received by the information reception unit 12 and the motor specification data pieces stored in the storage unit 11 are collated with each other, and the motor conforming to the machine conditions is selected from among the plurality of types of the motors included in the motor specification data pieces. Next, the amplifier capable of driving the selected motor is selected from among the plurality of types of the amplifiers included in the amplifier specification data pieces. Accordingly, the motor system (i.e., the motor and the amplifier) conforming to the machine conditions received by the information reception unit 12 is selected from among a plurality of the motor systems. In the present embodiment, the selection processing by the selection unit 14 is executed when the start-up determination unit 13 determines that the start-up can be performed and not executed when the start-up determination unit 13 determines that the start-up cannot be performed.

In the above-described embodiment, the parameters indicated in Table 2 and Table 3 are exemplified as the specification data pieces of the motor system. However, the parameters are not limited to the above-described ones, and, for example, break point information, seal friction torque, or the like described in Japanese Unexamined Patent Publication (Kokai) No. 2015-27244 may be included as the specification data pieces of the motor system.

FIG. 3 is a flowchart illustrating an example of an operation flow of the selection apparatus illustrated in FIG. 1.

When a user operates the terminal 3-1, 3-2, or 3-3 and inputs the start-up information (a password) and necessary machine conditions of the motor system, the start-up information and the machine conditions are transmitted to the information reception unit 12 via the network. When the start-up information is the specific information, upon input of the machine conditions by the terminal 3-1, 3-2, or 3-3, the specific information of the terminal used for the input of the machine conditions is transmitted together with the machine conditions to the information reception unit 12 via the network 2.

In step S101, the information reception unit 12 receives the input start-up information and machine conditions. The information reception unit 12 transmits the received start-up information to the start-up determination unit 13 and the received machine conditions to the selection unit 14.

In step S102, the start-up determination unit 13 collates the start-up information received by the information reception unit 12 with the start-up condition stored in the storage unit 11. The start-up determination unit 13 determines that the start-up can be performed when the start-up information received by the information reception unit 12 is coincident with the start-up condition stored in the storage unit 11, and the processing proceeds to step S103. On the other hand, the start-up determination unit 13 determines that the start-up cannot be performed when the start-up information received by the information reception unit 12 is not coincident with the start-up condition stored in the storage unit 11, and the processing proceeds to step S105. The determination result by the start-up determination unit 13 is transmitted to the selection unit 14.

In step S103, the selection unit 14 collates the machine conditions received by the information reception unit 12 with the specification data pieces stored in the storage unit 11 and executes the selection processing for selecting the motor system conforming to the machine conditions from among the plurality of the motor systems.

In step S104 subsequent to step S103, the information output unit 15 transmits information of the selection result by the selection unit 14 to the terminal(s) 3-1, 3-2, and/or 3-3 via the network 2. As described above, the terminals 3-1, 3-2, and 3-3 include the display units and can display the selection result received from the information output unit 15.

On the other hand, in step S102, when the start-up determination unit 13 determines that the start-up cannot be performed, in step S105, the selection unit 14 is not started up and does not execute the selection processing.

In step S106 subsequent to step S105, the information output unit 15 transmits information of "unselectable" to the terminal(s) 3-1, 3-2, and/or 3-3 via the network 2. In this case, "unselectable" is displayed on the display units of the terminals 3-1, 3-2, and 3-3.

As described above, according to the present embodiment, in the network system 100 which provides the selection apparatus 1 for selecting the motor system via the network 2, the input start-up information is collated with the start-up condition stored in the storage unit 11 to determine whether the start-up can be performed or not, and when the start-up determination unit 13 determines that the start-up can be performed, the selection processing for selecting the motor system conforming to the machine conditions from among a plurality of the motor systems is executed by collating the input machine conditions with the specification data pieces stored in the storage unit 11, however, when the start-up determination unit 13 determines that the start-up cannot be performed, the selection processing is not executed, so that the selection result can be disclosed to only a specific user, and the security can be ensured. When a third party on the network inputs various machine conditions to the selection apparatus and tries to acquire a plurality of selection results, collation processing by the start-up determination unit 13 determines that the start-up cannot be performed and the selection processing is not performed, and accordingly, there is no risk that information of the motor system is estimated by the third party.

In the above-described embodiment, when the start-up determination unit 13 determines that the start-up cannot be performed, the selection unit 14 is not started up and does not execute the selection processing, however, as a variation thereof, the selection unit 14 may be started up by partially limiting functions thereof. FIG. 4 is a flowchart illustrating a variation of the operation flow of the selection apparatus illustrated in FIG. 1.

In FIG. 4, each processing in steps S101 to S103 is the same as that is described with reference to FIG. 3, and the description thereof is omitted.

In step S102, the start-up determination unit 13 determines that the start-up cannot be performed when the start-up information received by the information reception unit 12 is not coincident with the start-up condition stored in the storage unit 11, and the processing proceeds to step S107.

In step S107, the selection unit 14 selects the motor conforming to the machine conditions received by the information reception unit 12 from a part of the motors among the plurality of motors by collating the machine conditions received by the information reception unit 12 with the motor specification data pieces stored in the storage unit 11 and selects the amplifier capable of driving the selected motor from a part of the amplifiers among the plurality of the amplifiers with reference to the amplifier specification data stored in the storage unit 11. In other words, in the present variation, the number of selection candidates of the motors and the amplifiers when the start-up determination unit 13 determines that the start-up cannot be performed are narrowed down than the number of selection candidates when it is determined that the start-up can be performed. It can be thought that, for example, versatile motors and amplifiers which have no problem when information thereof are known by the third party are set as the motors and the amplifiers to be the selection candidates when the start-up determination unit 13 determines that the start-up cannot be performed.

In step S104, the information output unit 15 transmits information of the selection result by the selection unit 14 to the terminal(s) 3-1, 3-2, and/or 3-3 via the network 2. As described above, the terminals 3-1, 3-2, and 3-3 include the display units and can display the selection result received from the information output unit 15.

The present invention is described above through the embodiments of the invention, however, the above-described embodiments are not meant to limit the scope of the present invention. Further, embodiments as combinations of the features described in the embodiments of the present invention can be included in the technical scope of the present invention, however, all of the combinations of the features are not always essential to the means for solution according to the invention. Furthermore, it will be obvious to a person skilled in the art that various modifications and improvements can be made to the above-described embodiments.

Further, it is to be noted that the execution order of each processing in the operations, procedures, steps, processes, stages and the like of the apparatuses, systems, programs, and methods described in the scope of claims, the specification, and the drawings can be realized in an arbitrary order as long as it is not especially and expressly described as "previous to", "prior to", and the like, and an output of former processing is not used in latter processing. Regarding the scope of claims, the specification, and the operation flows in the drawings, if "first", "next", "then", and the like are used in the description for convenience sake, these expressions do not mean that the implementation in this order is essential.

According to the present invention, the selection apparatus for selecting the motor system and the network system can be realized in which a selection result is disclosed only to a specific user.

According to an embodiment of the present invention, in the network system which provides the selection apparatus for selecting the motor system via the network, the input start-up information is collated with the start-up condition stored in the storage unit to determine whether the start-up can be performed or not, and when the start-up determination unit determines that the start-up can be performed, the selection processing for selecting the motor system conforming to the machine conditions from among a plurality of the motor systems is executed by collating the input machine conditions with the specification data pieces stored in the storage unit, however, when the start-up determination unit determines that the start-up cannot be performed, the selection processing is not executed, so that the selection result can be disclosed to only a specific user, and the security can be ensured. Accordingly, when a third party on the network inputs various machine conditions to the selection apparatus and tries to acquire a plurality of selection results, the collation processing by the start-up determination unit determines that the start-up cannot be performed and the selection processing is not performed, so that there is no risk that information of the motor system is estimated by the third party. When the selection apparatus for selecting the motor system is provided via the network, the motor system can be selected based on the latest information, and according to the present invention, security can be further improved.

Further, as in the variation of the embodiment of the present invention, only a part of the selection processing may be executed when it is determined that the start-up cannot be performed as a result of collation of the input start-up information and the start-up condition stored in the storage unit, and a flexible handling can be made, for example, when the start-up determination unit determines that the start-up cannot be performed, versatile motors and amplifiers which have no problem when information thereof are known by the third party are set as the motors and the amplifiers to be the selection candidates.

What is claimed is:

1. A selection apparatus for selecting a motor system, the selection apparatus comprising:
    a storage unit configured to store a start-up condition of the selection apparatus and specification data representing performance of each of a plurality of the motor systems;
    an information reception unit configured to receive input start-up information and machine condition;
    a start-up determination unit configured to determine that start-up can be performed when the start-up information received by the information reception unit is coincident with the start-up condition stored in the storage unit and determine that start-up cannot be performed in the case of noncoincidence thereof;
    a selection unit configured to, when the start-up determination unit determines that start-up can be performed, collate the machine condition received by the information reception unit with the specification data stored in the storage unit and execute selection processing for selecting the motor system conforming to the relevant machine condition from among a plurality of the motor systems and, when the start-up determination unit determines that start-up cannot be performed, the selection unit selects a motor conforming to the machine condition received by the information reception unit from a part of motors among the plurality of the motors by collating the machine condition received by the information reception unit with the motor specification data and
    selects an amplifier capable of driving the selected motor from a part of amplifiers among the plurality of the amplifiers with reference to the amplifier specification data; and
    an information output unit configured to output a processing result by the selection unit.

2. The selection apparatus according to claim 1, wherein the motor system includes a motor and an amplifier configured to supply electricity to the motor,
    the specification data includes motor specification data representing performance of each of a plurality of the motors and amplifier specification data representing performance of each of a plurality of the amplifiers, and
    the selection unit executes, as the selection processing executed when the start-up determination unit determines that start-up can be performed, processing in which
    a motor conforming to the machine condition received by the information reception unit is selected from among the plurality of the motors by collating the machine condition received by the information reception unit with the motor specification data, and an amplifier capable of driving the selected motor is selected from among the plurality of the amplifiers with reference to the amplifier specification data.

3. A network system comprising:
a selection apparatus comprising:
a storage unit configured to store a start-up condition of the selection apparatus and specification data representing performance of each of a plurality of the motor systems;
an information reception unit configured to receive input start-up information and machine condition;
a start-up determination unit configured to determine that start-up can be performed when the start-up information received by the information reception unit is coincident with the start-up condition stored in the storage unit and determine that start-up cannot be performed in the case of noncoincidence thereof;
a selection unit configured to, when the start-up determination unit determines that start-up can be performed, collate the machine condition received by the information reception unit with the specification data stored in the storage unit and execute selection processing for selecting the motor system conforming to the relevant machine condition from among a plurality of the motor systems and, when the start-up determination unit determines that start-up cannot be performed, the selection unit selects a motor conforming to the machine condition received by the information reception unit from a part of motors among the plurality of the motors by collating the machine condition received by the information reception unit with the motor specification data and selects an amplifier capable of driving the selected motor from a part of amplifiers among the plurality of the amplifiers with reference to the amplifier specification data; and
an information output unit configured to output a processing result by the selection unit; and
a terminal configured to be communicably connected to the information reception unit via a network and receive an input of the machine condition from a user.

* * * * *